United States Patent
Takei et al.

(10) Patent No.: US 8,421,076 B2
(45) Date of Patent: Apr. 16, 2013

(54) INSULATING SUBSTRATE FOR SEMICONDUCTOR APPARATUS, SEMICONDUCTOR APPARATUS, AND METHOD FOR MANUFACTURING SEMICONDUCTOR APPARATUS

(75) Inventors: Michiko Takei, Osaka (JP); Shin Matsumoto, Osaka (JP); Kazuhide Tomiyasu, Osaka (JP); Yasumori Fukushima, Osaka (JP); Yutaka Takafuji, Osaka (JP)

(73) Assignee: Sharp Kabushiki Kaisha, Osaka (JP)

( * ) Notice: Subject to any disclaimer, the term of this patent is extended or adjusted under 35 U.S.C. 154(b) by 223 days.

(21) Appl. No.: 12/674,560

(22) PCT Filed: Sep. 8, 2008

(86) PCT No.: PCT/JP2008/066190
§ 371 (c)(1),
(2), (4) Date: Feb. 22, 2010

(87) PCT Pub. No.: WO2009/084284
PCT Pub. Date: Jul. 9, 2009

(65) Prior Publication Data
US 2011/0272694 A1    Nov. 10, 2011

(30) Foreign Application Priority Data
Dec. 27, 2007 (JP) ................................. 2007-338329

(51) Int. Cl.
*H01L 29/72* (2006.01)
(52) U.S. Cl.
USPC 257/57; 257/66; 257/E21.122; 257/E21.143; 257/E21.567; 257/E21.568

(58) Field of Classification Search ............... 257/27, 257/66, E21.088, E21.122, E21.143, E21.567, 257/E21.568
See application file for complete search history.

(56) References Cited

U.S. PATENT DOCUMENTS

| | | |
|---|---|---|
| 5,466,631 A | 11/1995 | Ichikawa et al. |
| 5,869,387 A | 2/1999 | Sato et al. |
| 6,146,979 A | 11/2000 | Henley et al. |

(Continued)

FOREIGN PATENT DOCUMENTS

| | | |
|---|---|---|
| JP | 2004-134675 A | 4/2004 |
| JP | 2006-5245 A | 1/2006 |
| JP | 2006-210898 A | 8/2006 |
| JP | 2006-344666 A | 12/2006 |

OTHER PUBLICATIONS

U.S. Notice of Allowance, dated Apr. 3, 2012, for U.S. Appl. No. 12/682,221.
US Office Action issued in co-pending U.S. Appl. No. 12/682,221 dated Jan. 23, 2012 is attached.

(Continued)

*Primary Examiner* — Edward Wojciechowicz
(74) *Attorney, Agent, or Firm* — Birch, Stewart, Kolasch & Birch, LLP

(57) ABSTRACT

The present invention is intended to provide a glass substrate (20), made of an insulating material, which can constitute a semiconductor apparatus (10) by transferring a single crystal silicon film (50) or a substrate including a semiconductor device onto a surface (24) of the insulating substrate, a transferred surface (26) being part of the surface (24), the single crystal silicon film (50) capable of being provided on the transferred surface (26), and the transferred surface (26) having an arithmetic mean roughness of not more than 0.4 nm.

22 Claims, 9 Drawing Sheets

U.S. PATENT DOCUMENTS

| | | |
|---|---|---|
| 6,159,824 A | 12/2000 | Henley et al. |
| 6,558,802 B1 | 5/2003 | Henley et al. |
| 6,602,767 B2 | 8/2003 | Nishida et al. |
| 6,890,838 B2 | 5/2005 | Henley et al. |
| 7,563,693 B2 | 7/2009 | Fukushima et al. |
| 2001/0041423 A1 | 11/2001 | Nishida et al. |
| 2004/0061176 A1 | 4/2004 | Takafuji et al. |
| 2004/0171232 A1 | 9/2004 | Cayrefourcq et al. |
| 2005/0074954 A1 | 4/2005 | Yamanaka |
| 2005/0104067 A1* | 5/2005 | Chu et al. .................. 257/66 |
| 2005/0282019 A1 | 12/2005 | Fukushima et al. |
| 2005/0282306 A1 | 12/2005 | Yamanaka |
| 2006/0057820 A1 | 3/2006 | Yamanaka |
| 2007/0277875 A1 | 12/2007 | Gadkaree et al. |
| 2008/0014714 A1* | 1/2008 | Bourdelle et al. ............ 438/455 |
| 2008/0070340 A1 | 3/2008 | Borrelli et al. |
| 2008/0305317 A1 | 12/2008 | Ito et al. |
| 2009/0061593 A1 | 3/2009 | Gadkaree et al. |
| 2009/0095956 A1 | 4/2009 | Takafuji et al. |
| 2009/0170298 A1 | 7/2009 | Brailove |
| 2009/0191667 A1 | 7/2009 | Higashino et al. |
| 2012/0001293 A1 | 1/2012 | Ben Mohamed et al. |

OTHER PUBLICATIONS

"Ultraclean ULSI Technology" Tadahiro Ohmi, Baifukan, p. 172.
"Silicon Wafer Bonding Technology for VLSI and MEMS application", S.S. Lyer et al., 2002, pp. 36-43.

* cited by examiner

INSULATING SUBSTRATE FOR SEMICONDUCTOR APPARATUS, SEMICONDUCTOR APPARATUS, AND METHOD FOR MANUFACTURING SEMICONDUCTOR APPARATUS

TECHNICAL FIELD

The present invention mainly relates to a semiconductor apparatus in which a semiconductor layer is provided on an insulating substrate, and a method for manufacturing the semiconductor apparatus. More specifically, the present invention relates to (i) a semiconductor apparatus in which constituents such as a single crystal silicon chip, a semiconductor chip, and a semiconductor device are transferred onto a substrate such as a glass substrate so that at least a single crystal silicon film is formed on the substrate, and (ii) a method for manufacturing the semiconductor apparatus.

BACKGROUND ART

Conventionally, the following techniques have been proposed, and have greatly developed in response to widespread use of a liquid crystal display: (i) an integrated circuit device technique in which a single crystal silicon substrate is processed so that several hundred millions of transistors are formed on the single crystal silicon substrate and (ii) a thin-film transistor (TFT) technique in which a polycrystalline semiconductor film such as a polycrystalline silicon film is formed on a light-transmitting amorphous material such as a glass substrate, and is then processed so as to be converted into transistors from which a picture element, a switching element, a driver and the like of a liquid crystal display device are made.

(Integrated Circuit Element Technique)

Of the above-mentioned techniques, for example, the integrated circuit element technique is such that a commercially available single crystal silicon wafer having a thickness of less than 1 mm and a diameter of approximately 200 mm is processed so that a large number of transistors are formed on the silicon wafer.

(Thin-Film Transistor Technique)

Meanwhile, in a case where the thin-film transistor technique is applied to a TFT-liquid crystal display device, an amorphous silicon film, formed on a light-transmitting (amorphous high distortion point) non-alkali glass substrate, is melted and polycrystalized by heating such as laser heating, and is then processed so as to be converted into a MOS transistor which functions as a switching element of the TFT-liquid crystal display device, for example.

(Semiconductor Apparatus)

Further, a technique in which a silicon film, especially a single crystal silicon film is formed on an insulator by a transfer method is proposed. A semiconductor apparatus manufactured by the transfer method may be referred to as a SOI (Silicon On Insulator) substrate.

(Semiconductor Apparatus in Integrated Circuit)

In the field of integrated circuit, the semiconductor apparatus is used to improve a function of a semiconductor element such as a transistor.

Specifically, in a case where a transistor is manufactured with the use of a semiconductor apparatus, elements are completely separated. This imposes little restriction on operation, thereby allowing the transistor to have good property and high performance.

A substrate used in the field of integrated circuit is not particularly limited as long as it is an insulator (or an insulating film). The substrate may be transparent or non-transparent, and may be crystalline or amorphous.

(Display Device)

In contrast, in the field of display device such as a TFT-LCD (Liquid Crystal Display) device and a TFT-OLED (Organic Light Emitting Diode) display device, such a substrate needs to be transparent, and typically is an amorphous substrate such as a glass substrate.

An amorphous silicon film or a polysilicon film is formed on the substrate, and the TFT is formed based on this. The TFT is used as a switching element for so-called active matrix driving of the display device.

Further, in order to integrate, on the substrate, devices used for the active matrix driving such as a peripheral driver and a timing controller, a silicon film formation substrate that is higher in performance has been studied.

(Polysilicon Film)

Conventionally, in a case where a polysilicon film is used as a silicon film, a localized state in a band gap that is caused by incomplete crystal or a localized state in a defective band gap in the vicinity of a crystal grain boundary easily occurs. The occurrence of such a localized state causes a reduction in mobility and an increase in subthreshold coefficient (S coefficient), thereby deteriorating performance of a transistor.

Further, in a case where a silicon film in a polysilicon film has incomplete crystal, a fixed charge is easily formed on an interface between the silicon film and a gate insulating film in the thin-film transistor. The formation of such a fixed charge makes it difficult (i) to control a threshold voltage of the thin-film transistor and (ii) to attain a desired threshold voltage value.

Especially in a case where a polysilicon film is formed on a large glass substrate, it is difficult to miniaturize a device such as a transistor. As a result, it is difficult to improve performance and to increase speed of such a device.

Further, in a case where a polysilicon film is obtained by heating an amorphous silicon film by irradiation with a laser beam, there is a large variation in mobility and threshold voltage of a transistor. This is because fluctuation in irradiation energy of the laser beam causes an unevenness in grain size of the polysilicon film thus obtained.

Further, in a case where a polysilicon film is obtained by heating an amorphous silicon film by irradiation with a laser beam, temperature of the silicon film temporarily rises nearly to a melting point of silicon due to heating by the laser beam. This causes an alkali metal and the like contained in a glass substrate to be diffused into the silicon film, thereby lowering properties of the transistor.

(Single Crystal)

In order to solve the problems caused by use of a polysilicon film, a device using single crystal silicon has been studied.

For example, Patent Literature 1 discloses such a device using single crystal silicon.

Specifically, Patent Literature 1 discloses a semiconductor apparatus in which a single crystal silicon film is provided on a coating film formed on an insulating substrate (glass substrate) for semiconductor apparatus. In the semiconductor apparatus disclosed in Patent Literature 1, hydrogen ions are implanted into a single crystal silicon substrate so that the single crystal silicon substrate is divided. Thus, the single crystal silicon film is obtained.

CITATION LIST

Patent Literature 1
Japanese Patent Application Publication, Tokukai, No. 2004-134675 A (Publication Date: Apr. 30, 2004)

SUMMARY OF INVENTION

Bubble

However, such a conventional semiconductor apparatus could cause a problem that a bubble occurred between a glass substrate and a single crystal silicon film. Here, the bubble refers to a minute air bubble generated in a region between the glass substrate and the single crystal silicon film. In such a region, the single crystal silicon film is floating above the glass substrate, that is, the single crystal silicon film is not in contact with the glass substrate. This is described below.

(Structure of Semiconductor Apparatus)

First, typical structure and manufacturing method of a semiconductor apparatus are described below with reference to (a) through (e) of FIG. 8. (a) through (e) of FIG. 8 are cross-sectional views schematically illustrating manufacturing steps of the semiconductor apparatus, respectively.

A semiconductor apparatus 10 is arranged such that a single crystal silicon film 50 is formed on an insulating substrate 20 (e.g. glass substrate) for a semiconductor apparatus, as shown in (e) of FIG. 8 which is a cross-sectional view schematically illustrating an arrangement of the semiconductor apparatus 10.

(Method for Manufacturing Semiconductor Apparatus)

The semiconductor apparatus 10 is manufactured as follows.

Specifically, first, the insulating substrate 20 (e.g. glass substrate) for a semiconductor apparatus and a single crystal silicon substrate 60 are prepared (see (a) and (b) of FIG. 8).

(Ion Implantation)

A separatory material is implanted into the single crystal silicon substrate 60, as shown in (c) of FIG. 8. Specifically, hydrogen ions serving as the separatory material are injected from a surface (injection surface 62) of the single crystal silicon substrate 60. The hydrogen ions are injected from almost the entire injection surface 62 (see the arrows shown in (c) of FIG. 8).

After the injection, the hydrogen ions thus injected reach a predetermine depth in the single crystal silicon substrate 60, and remain there, Thus, a peel layer (injection layer of the hydrogen ions) 64 is formed.

In other words, the hydrogen ions thus injected forms a profile of how a concentration is distributed in a depth direction of the single crystal silicon substrate 60. It should be noted that a region in the vicinity of a peak position of the concentration serves as the peel layer 64.

(Combining)

Next, as shown in (d) of FIG. 8, the insulating substrate 20 shown in (a) of FIG. 8 is combined with the single crystal silicon substrate 60 shown in (c) of FIG. 8 so that the injection surface 62 of the single crystal silicon substrate 60 makes contact with the insulating substrate 20.

(Separation)

Next, the single crystal silicon substrate 60 is separated so that a single crystal silicon film 50 is formed on the insulating substrate 20.

Specifically, the insulating substrate 20, with which the single crystal silicon substrate 60 is combined, is heated at 600° C. Thus, as shown in (e) of FIG. 8, the single crystal silicon substrate 60 is separated into a single crystal silicon substrate main body 66 and the single crystal silicon film 50 along the peel layer 64 so that a semiconductor apparatus 10, in which the single crystal silicon film 50 is formed on the insulating substrate 20, is obtained.

(Device Transfer)

The above description has dealt with a case where the single crystal silicon substrate 60 is combined with the insulating substrate 20 so that a semiconductor apparatus, in which the single crystal silicon film 50 is formed on the insulating substrate 20, is obtained. However, instead of the single crystal silicon substrate 60 (semiconductor film), a semiconductor substrate (semiconductor film) on which a device and the like are formed in advance can be combined with the insulating substrate 20 through a similar process.

(Bubble)

The semiconductor apparatus 10 formed as above causes a problem that a bubble occurs, for example, in an interface (see IF in FIG. 8) between the single crystal silicon film 50 and the insulating substrate 20.

Specifically, a bubble 80 occurs in the interface between the single crystal silicon film 50 and the insulating substrate 20, as shown in FIG. 9. FIG. 9 is a cross-sectional view illustrating the semiconductor apparatus 10. The single crystal silicon film 50 that is transferred onto the insulating substrate 20 is not in contact with the insulating substrate 20 at a part where the bubble 80 occurs.

(Cause for Bubble)

Although there are wide variety of factors in causing the bubble 80, the bubble 80 is often caused in a heating process carried out when the single crystal silicon substrate 60 combined with the insulating substrate 20 is separated along the peel layer 64.

That is, the bubble 80 is likely to occur in the heating process carried out when the semiconductor film or the semiconductor substrate on which a device and the like are formed is separated along the peel layer 64 after the semiconductor film or the semiconductor substrate is combined with a light-transmitting substrate. It is hypothesized that, in many cases, the bubble 80 is formed as follows: hydrogen, water, and the like contained in the semiconductor film are assembled in a region having a low binding energy in the interface IF.

The semiconductor apparatus 10 in which the bubble 80 occurs in the interface IF cannot be used as a proper semiconductor apparatus. This causes a reduction in yield of the semiconductor apparatus 10.

The present invention was attained in view of the above problems, and an object of the present invention is to provide (i) an insulating substrate for a semiconductor apparatus in which a bubble hardly occurs in an interface of transfer, (ii) the semiconductor apparatus, and (iii) a method for manufacturing the semiconductor apparatus.

In order to attain the above object, an insulating substrate of the present invention is an insulating substrate, made of an insulating material, which can constitute a semiconductor apparatus by transferring a silicon film onto a surface of the insulating substrate, a transferred surface being part of the surface, the silicon film capable of being provided on the transferred surface, and the transferred surface having an arithmetic mean roughness of not more than 0.4 nm.

According to the arrangement, the surface of the insulating substrate to which the silicon film is transferred has low surface roughness, that is, has good smoothness. Therefore, in a case where a silicon film such as a single crystal silicon film is transferred onto the insulating substrate, a bubble (air bubble) or the like hardly occurs in an interface between the silicon film and the insulating substrate. Thus, a good semiconductor apparatus can be easily obtained.

Further, the insulating substrate of the present invention is preferably arranged such that the transferred surface has an arithmetic mean roughness of not more than 0.3 nm.

Further, the insulating substrate of the present invention is preferably arranged such that the transferred surface has an arithmetic mean roughness of not more than 0.2 nm.

According to the arrangement, in which the surface of the insulating substrate has better smoothness, it is possible to more surely suppress occurrence of a bubble (air bubble) in the interface.

Further, the insulating substrate of the present invention is preferably arranged such that the insulating material is a glass material, quartz or a plastic material. The insulating material is especially preferably a glass material or quartz.

Further, the insulating substrate of the present invention is preferably arranged such that the glass material is exposed in the transferred surface.

According to the arrangement, siloxane bonding is likely to occur between the silicon film and the insulating substrate. This makes it possible to easily increase a binding energy between the silicon film and the insulating substrate.

Further, the insulating substrate of the present invention is preferably arranged such that an oxide film is provided on the transferred surface.

According to the arrangement, for example even in a case where the insulating substrate is made of a material (e.g. plastic substrate) other than glass, it is possible to easily improve hydrophilicity of the transferring surface. As a result, it is possible to easily increase a binding energy between the silicon film and the insulating substrate.

Further, the insulating substrate of the present invention is preferably arranged such that the transferred surface is made hydrophilic.

According to the arrangement, in which the transferred surface is made hydrophilic, self-combining tends to occur between the transferred surface and the silicon film.

Further, the insulating substrate of the present invention is preferably arranged such that the transferred surface is made hydrophilic with use of a mixture solution of ammonium hydroxide, hydrogen peroxide solution, and water which mixture solution has a temperature of not less than 20° C. and not more than 40° C.

According to the arrangement, the transferred surface is made hydrophilic with the use of the mixture solution of a low temperature. Therefore, it is possible to suppress the insulating substrate not having a smooth surface. This is especially effective in a case where the insulating substrate is made of glass which is vulnerable to alkali.

Further, the insulating substrate of the present invention is preferably arranged such that the transferred surface has a contact angle of not more than 5°.

According to the arrangement, in which the transferred surface has high wettability and hydrophilicity, it is possible to increase a binding energy between the silicon film and the insulating substrate.

Note that the contact angle refers to a contact angle with respect to water.

Further, the insulating substrate of the present invention is preferably arranged such that the transferred surface is exposed to plasma under an atmospheric pressure.

According to the arrangement, in which the transferred surface is exposed to plasma under an atmospheric pressure, the transferred surface is hardly damaged. As a result, it is possible to make the transferred surface hydrophilic (make the contact angle of the transferred surface small) without making the transferred surface rough.

Further, the insulating substrate of the present invention may be arranged such that the insulating substrate has a rectangular shape when it is viewed from above, and has (i) a longer side whose length of not less than 300 mm and not more than 3000 mm and (ii) a shorter side whose length is of not less than 300 mm and not more than 3000 mm.

Even if the insulating substrate of the present invention is large in size, it is possible to transfer a silicon film onto the surface of the insulating substrate. Therefore, it is possible to more effectively form the silicon film not only in a case where the insulating substrate is relatively small, i.e., has a side whose length is less than 300 nm, but also in a case where the insulating substrate is large as above.

A semiconductor apparatus of the present invention, wherein: at least a part of a silicon substrate which part includes a transferring surface is transferred onto the transferred surface of the insulating substrate so that the silicon film is provided on the transferred surface.

According to the arrangement, even a thin silicon film, especially single crystal silicon film can be easily formed on the insulating film although it is difficult to form such a thin silicon film directly on the insulating substrate.

Further, the semiconductor apparatus of the present invention may be arranged such that the silicon substrate is a single crystal silicon substrate.

According to the arrangement, in which the silicon film to be formed on the insulating substrate is a single crystal silicon film, a semiconductor element formed with the use of the silicon film can be made higher in performance.

Further, since the single crystal silicon film can be easily microfabricated, the semiconductor element can be finely manufactured.

Further, the semiconductor apparatus of the present invention may be arranged such that the silicon substrate is a silicon semiconductor substrate.

According to the arrangement, the silicon substrate is a semiconductor from the beginning. Therefore, a circuit having excellent properties can be formed on the insulating substrate such as a glass substrate.

In a case where a single crystal silicon film that is turned into a semiconductor is transferred, the above problem which arises in the device manufactured with the use of polysilicon can be solved. Specifically, in a case where polysilicon is formed by laser crystallization, it is difficult to obtain good crystal. As a result, a trouble is likely to occur in circuit operation. In contrast, in a case where the single crystal silicon film is used, it is possible to improve unevenness in property, especially unevenness in threshold value (Vth). As a result, it is possible to realize good circuit operation.

Further, the semiconductor apparatus of the present invention may be arranged such that a semiconductor apparatus is provided on the silicon substrate.

According to the arrangement, it is possible to easily form, on the insulating substrate, a desired semiconductor element.

Further, the semiconductor apparatus of the present invention is preferably arranged such that the transferring surface of the silicon substrate is made hydrophilic.

Further, the semiconductor apparatus of the present invention is preferably arranged such that the transferring surface of the silicon substrate has a contact angle of not more than 5°.

According to the arrangement, the transferring surface has high hydrophilicity. As such, it is possible to increase a binding energy between the silicon substrate and the insulating substrate.

Further, the semiconductor apparatus of the present invention is preferably arranged such that the transferring surface of the silicon substrate is exposed to plasma under an atmospheric pressure.

According to the arrangement, in which the transferring surface of the silicon substrate is exposed to plasma under an atmospheric pressure, the transferring surface is hardly damaged. As a result, it is possible to make the transferring surface hydrophilic (make the contact angle of the transferring surface small) without making the transferring surface rough.

Further, the semiconductor apparatus of the present invention is preferably arranged such that at least one of an amorphous silicon transistor device and a polysilicon transistor device is provided in a region on the surface of the insulating substrate in which region no silicon film is provided.

According to the arrangement, it is possible to form, in a desired position on the insulating substrate, a desired device (the right device in the right place).

Specifically, a pixel transistor requires low off electric current, and therefore such a pixel transistor can be realized by an amorphous silicon (a-Si) TFT and a polysilicon (poly-Si) TFT. In contrast, a higher-performance transistor that is less uneven is required as a circuit section for operating such TFTs, and such a higher-performance transistor is preferably manufactured with the use of single crystal silicon.

In view of this, single crystal silicon is transferred onto a region in which the single crystal silicon is required. This easily allows a-Si, poly-Si, and single crystal silicon to coexist on a single substrate.

In order to attain the above object, a method of the present invention for manufacturing a semiconductor apparatus, includes the step of: forming a silicon film on a surface of an insulating substrate by combining a transferring surface of a silicon substrate with a transferred surface of the insulating substrate so that at least a part of the silicon substrate which part includes the transferring surface is transferred onto the transferred surface, the transferred surface having an arithmetic mean roughness of not more than 0.4 nm.

According to the method, in which the surfaces to be combined with each other have good smoothness, a bubble (air bubble) hardly occurs in an interface between the silicon film and the insulating substrate.

Further, in the method of the present invention, it is preferable that at least one of the transferring surface of the silicon substrate and the transferred surface of the insulating substrate is made hydrophilic before the transferring surface is combined with the transferred surface.

According to the method, in which the transferring surface and/or the transferred surface is made hydrophilic, self-combining is likely to occur at the interface. As a result, it is possible to increase a binding energy such as siloxane bonding.

Further, in the method of the present invention, it is preferable that said at least one of the transferring surface and the transferred surface is made hydrophilic with use of a mixture solution of ammonium hydroxide, hydrogen peroxide solution, and water which mixture solution has a temperature of not less than 20° C. and not more than 40° C.

According to the method, at least one of the transferring surface of the silicon substrate and the transferred surface of the insulating substrate is made hydrophilic with the use of the mixture solution of a low temperature. Therefore, it is possible to prevent the surface of the insulating substrate from getting rough. This is especially effective in a case where the insulating substrate is made of a material such as glass which is vulnerable to alkali.

Further, in the method of the present invention, it is possible that the transferring surface of the silicon substrate and the transferred surface of the insulating substrate are made hydrophilic with use of a mixture solution of ammonium hydroxide, hydrogen peroxide solution, and water before the transferring surface is combined with the transferred surface, a ratio of the ammonium hydroxide is smaller in the mixture solution used while the transferred surface of the insulating substrate is being made hydrophilic than in the mixture solution used while the transferring surface of the silicon substrate is being made hydrophilic.

According to the method, the insulating substrate and the silicon substrate can be washed and made hydrophilic without making the surface of the insulating substrate rough. Note that this is especially effective in a case where the insulating substrate is a glass substrate. As a result, it is possible to realize better transfer of the silicon substrate to the insulating substrate.

Further, in the method of the present invention, it is preferable that the transferred surface of the insulating substrate has a contact angle of not more than 5° before the transferring surface of the silicon substrate is combined with the transferred surface of the insulating substrate.

Further, in the method of the present invention, it is preferable that the transferring surface of the silicon substrate has a contact angle of not more than 5° before the transferring surface of the silicon substrate is combined with the transferred surface of the insulating substrate.

According to the method, in which each of the transferring surface and the transferred surface has high hydrophilicity, it is possible to increase a binding energy between the silicon substrate and the insulating substrate.

Further, in the method of the present invention, it is preferable that at least one of the transferred surface and the transferring surface is exposed to plasma under an atmospheric pressure before the transferring surface of the silicon substrate is combined with the transferred surface of the insulating substrate.

According to the method, in which at least one of the transferred surface and the transferring surface is exposed to plasma under an atmospheric pressure, the transferring surface is hardly damaged. As a result, it is possible to make the transferring surface hydrophilic (make the contact angle of the transferring surface small) without making the transferring surface rough.

Further, in the semiconductor apparatus of the present invention and in the method of the present invention, it is preferable that the insulating substrate is a glass substrate, and the silicon substrate is directly combined with the glass substrate.

According to the arrangement and the method, the silicon substrate is directly combined with a surface of the glass substrate. As such, the glass substrate has a large space for hydrogen, water, and the like to be diffused. Therefore, even if hydrogen, oxygen, and the like are generated due to the transfer, especially due to heat treatment after the transfer, it is possible to diffuse the hydrogen, oxygen, and the like toward a glass substrate side.

This allows a bubble (air bubble) or the like to hardly occur in the interface between the silicon film and the glass substrate. The insulating substrate is more preferably a glass substrate that is not subjected to thermal tightening.

Note that the term "thermal tightening" generally means heat treatment carried out at a temperature in a range from 600° C. to 700° C., for example.

Further, in the semiconductor apparatus of the present invention and in the method of the present invention, it is preferable that the insulating substrate and the silicon substrate are heated after the transferring surface of the silicon substrate is combined with the transferred surface of the insulating substrate, and are then rapidly cooled down.

According to the arrangement and the method, in which after the heating, temperature of the insulating substrate and the silicon substrate is rapidly cooled down, hydrogen, oxygen, and the like hardly accumulate in the interface between the silicon film and the insulating substrate. As a result, a bubble (air bubble) or the like hardly occurs.

Note that the rapid cooling down in temperature can be carried out at a rate of 2° C./sec, preferably at a rate of 5° C./sec, more preferably at a rate of 10° C./sec, for example.

As described above, the insulating substrate for the semiconductor apparatus of the present invention has a transferred surface on which a silicon film can be formed, the transferred surface having an arithmetic mean roughness of not more than 0.4 nm.

As such, it is possible to suppress occurrence of a bubble in an interface between the silicon film and the insulating substrate.

REFERENCE SIGNS LIST

Figure 1:
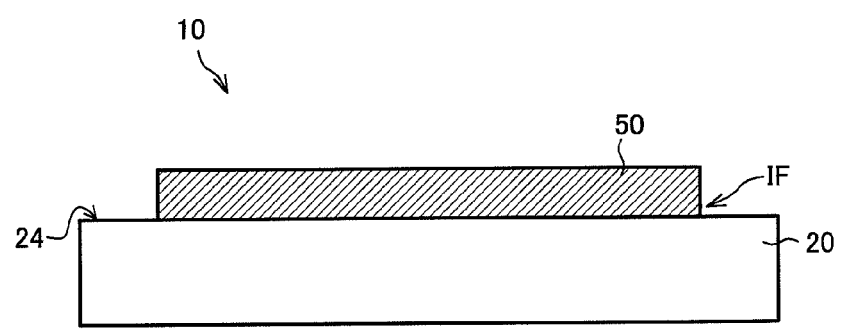
FIG. 1 is a cross-sectional view schematically illustrating an arrangement of a semiconductor apparatus of an embodiment of the present invention.

10: Semiconductor apparatus
20: Glass substrate (insulating substrate for a semiconductor apparatus)
22: First silicon oxide film (oxide film)
24: Surface
26: Transferred surface
50: Single crystal silicon film (silicon film, semiconductor device layer)
60: Single crystal silicon substrate (silicon substrate)
64: Peel layer
66: Single crystal silicon substrate main body
68: Transferring surface
70: Second silicon oxide film (oxide film)
80: Bubble (air bubble)
IF: Interface

DESCRIPTION OF EMBODIMENTS

Embodiment 1

One embodiment of the present invention is described below with reference to FIG. 1 and other drawings. FIG. 1 is a cross-sectional view schematically illustrating an arrangement of a semiconductor apparatus of the present embodiment.

(Outline of Structure)

A semiconductor apparatus 10 of the present embodiment includes (i) a glass substrate 20 (a transparent insulating substrate serving as an insulating substrate for semiconductor apparatus-use) and (ii) a single crystal silicon film 50 serving as a silicon film so that the single crystal silicon film 50 is provided on a surface 24 of the glass substrate 20.

Specifically, for example a light-transmitting amorphous non-alkali glass substrate having a high distortion point is suitably used as the glass substrate 20. More specifically, alkaline earth aluminoborosilicate glass such as Corning®#1737 glass manufactured by Corning Incorporated is used as the glass substrate 20.

(Outline of Manufacturing Method)

Next, the following description schematically describes a method for manufacturing the semiconductor apparatus 10 of the present embodiment.

The semiconductor apparatus 10 of the present embodiment is manufactured by substantially the same method as that described earlier with reference to (a) through (e) of FIG. 8. Specifically, a method can be used in which (i) hydrogen ions serving as a separatory material and the like are implanted, in advance, into the single crystal silicon substrate 60 serving as a silicon substrate (ii) the single crystal silicon substrate 60 is combined with the glass substrate 20, as described earlier with reference to (a) through (e) of FIG. 8 and (iii) the single crystal silicon substrate 60 which has been combined with the glass substrate 20 is then heated so that the single crystal silicon film 50 serving as a silicon film is transferred onto the glass substrate 20.

(Detail of Manufacturing Method)

Figure 2:
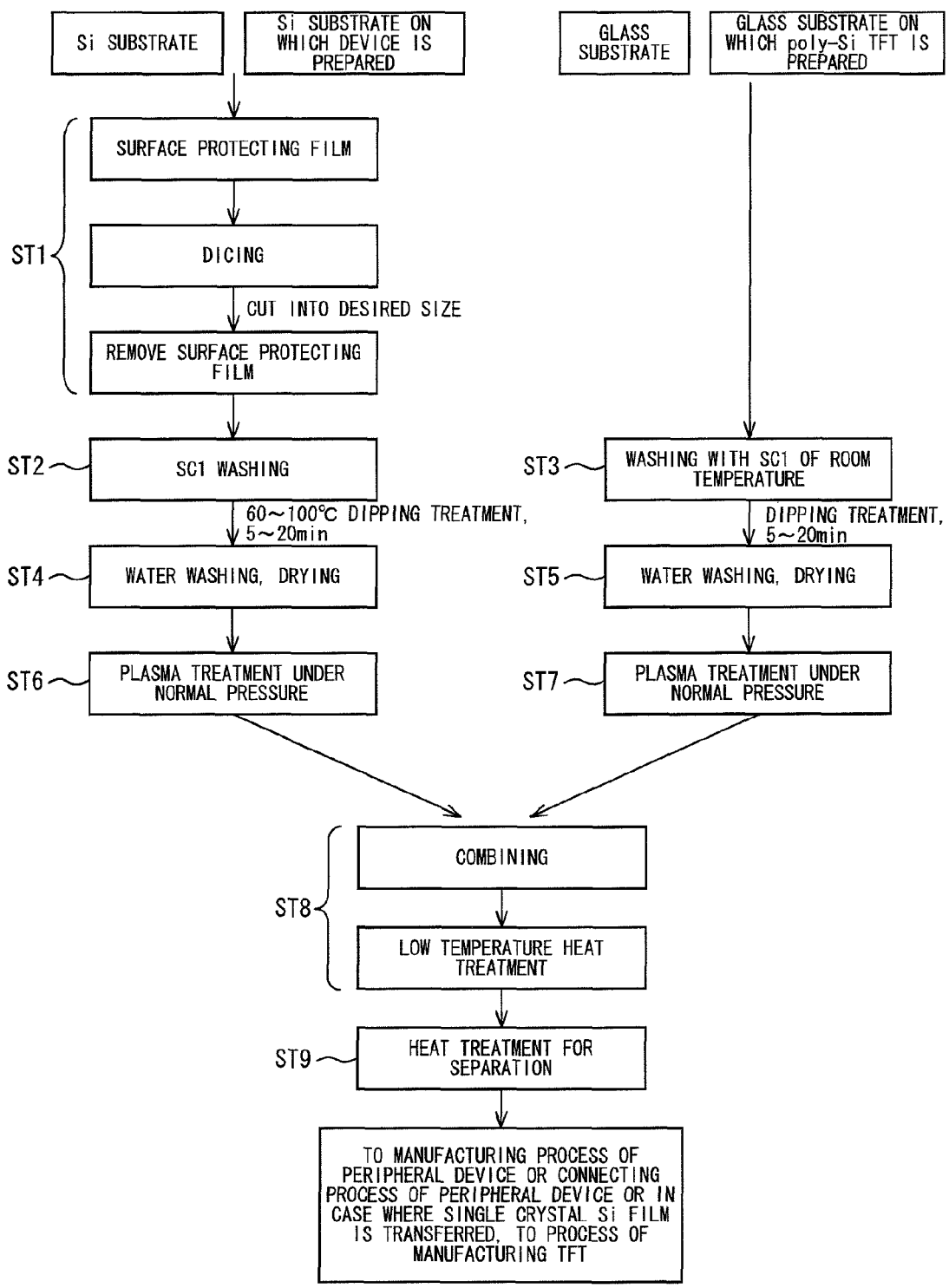
FIG. 2 is a flow chart schematically showing a manufacturing process of the semiconductor apparatus of the embodiment of the present invention.

The method for manufacturing the semiconductor apparatus 10 of the present embodiment is described below in detail with reference to FIG. 2 that is a flow chart (process flow chart) schematically showing the method.

Figure 8:
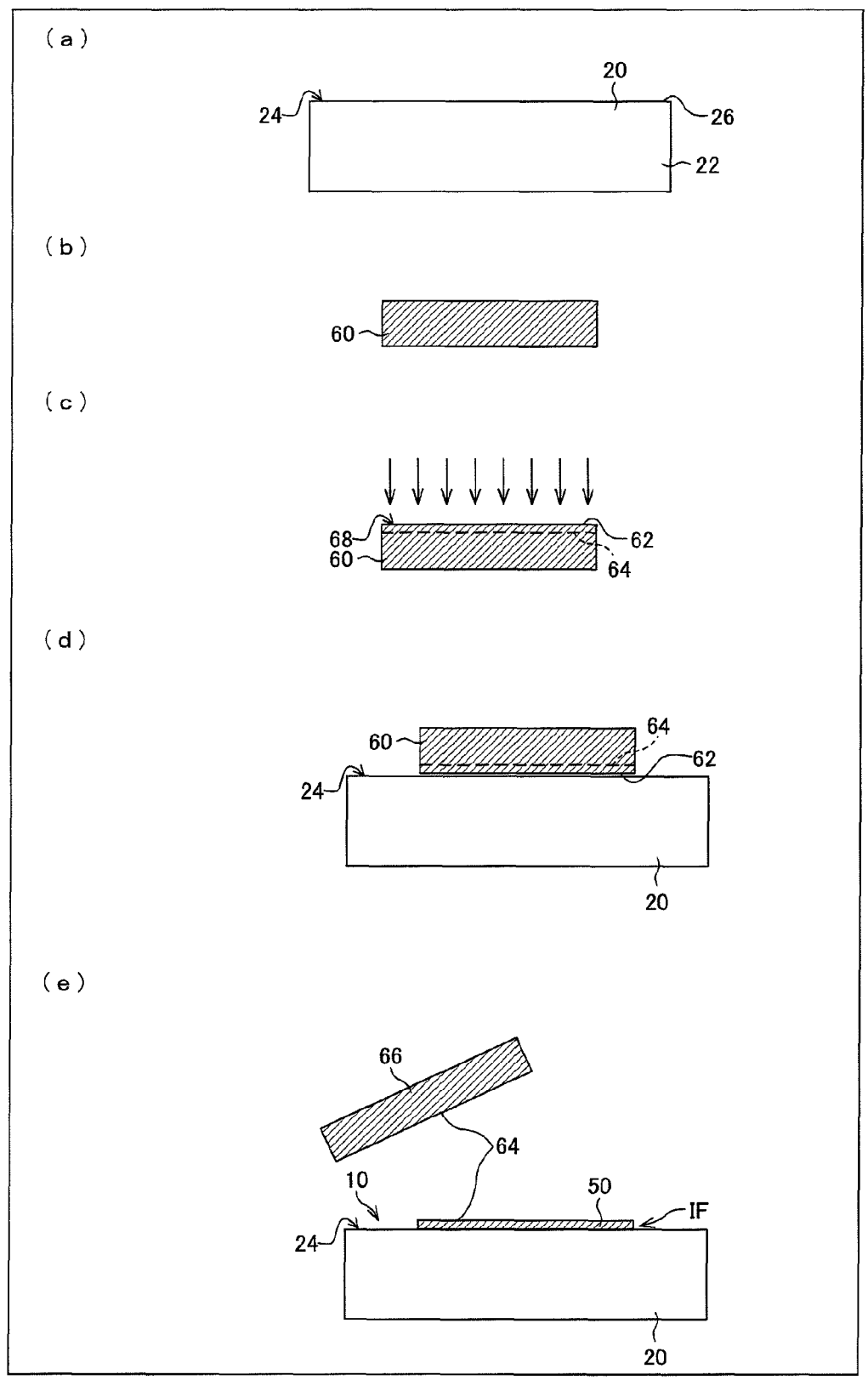
FIG. 8 is a cross-sectional view illustrating a manufacturing step of a semiconductor apparatus.
Figure 9:
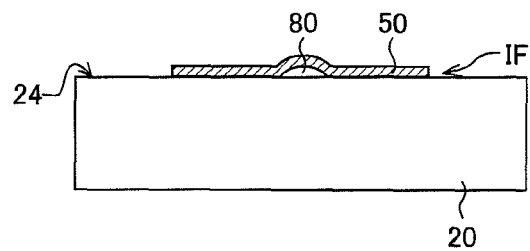
FIG. 9 is a cross-sectional view illustrating how an air bubble occurs in a semiconductor apparatus.

Note that FIG. 1, (a) through (e) of FIG. 8, and FIG. 9 should be mainly referred, as for members and reference numerals given to the respective members.

(Silicon Substrate: Separatory Material)

First, a separatory material is implanted into the single crystal silicon substrate (Si substrate) 60 to be combined with the glass substrate 20. Thus, a peel layer 64 is formed.

Specifically, hydrogen ions serving as the separatory material are implanted from a predetermined surface of the single crystal silicon substrate 60, i.e., from an implantation surface 62 serving as a hydrogen ion implanting surface (see the arrows in (c) of FIG. 8).

Thus, the hydrogen ions implanted from the implantation surface 62 reach a predetermined depth in the single crystal silicon substrate 60. A profile of how a concentration is distributed in a depth direction of the single crystal silicon substrate 60 is formed. It should be noted that a region in the vicinity of a peak position of the concentration serves as the peel layer 64.

(Silicon Substrate: Dicing (ST1 of FIG. 2))

Next, the single crystal silicon substrate (Si substrate) 60 is processed so as to have a desired size. Specifically, a surface protecting film such as a masking film is formed on the single crystal silicon substrate 60, and then the single crystal silicon substrate 60 is cut by a method such as dicing so as to have a desired size. After the cutting, the surface protecting film is removed.

(Silicon Substrate, Glass Substrate: SC1 Washing (ST2 and ST3 of FIG. 2))

Next, (i) the single crystal silicon substrate 60 thus processed so as to have a desired size and (ii) the surface 24 of the glass substrate 20 with which the single crystal silicon substrate 60 is to be combined are washed and made hydrophilic, concurrently.

In the present embodiment, the single crystal silicon substrate 60 is combined with the glass substrate 20 without the use of adhesive or the like. Therefore, factors such as surface states, degree of surface cleanliness, and degree of surface activity of each of the substrates become important.

Note that the combining of the single crystal silicon substrate 60 with the glass substrate 20 is realized by a contribution of van der Waals force, a contribution of electric dipole, and a contribution of hydrogen bonding, instead of by use of the adhesive or the like. Note that the substrates are easily combined with each other especially in a case where their surfaces are similar in balance of the three contributions. The following description deals with in detail a method of washing and the like.

In a case where water-insoluble substances such as an organic compound are present on the surfaces of the respective substrates, a metal contaminant is easily hindered from being effectively removed from each of the surfaces while the surfaces are being made hydrophobic. On this account, it is effective to remove such organic compounds from the respective surfaces in an initial step of the washing process.

In view of this, it is preferable that a mixture solution of ammonium hydroxide (ammonia solution) ($NH_4OH$), hydrogen peroxide solution ($H_2O_2$), and water (purified water) ($H_2O$) is used as a washing agent (washing solution) for the washing. That is, the substrates are washed with the use of a so-called SC1 (Standard Clean 1) solution.

The ammonium hydroxide tends to chemically react with copper (Cu), silver (Ag), nickel (Ni), cobalt (Co), calcium (Ca) or the like so that a complex is formed. An oxidizing property of the hydrogen peroxide solution and an etching effect of the ammonium hydroxide can interdependently remove such metal elements effectively.

Further, particles are often electrically stuck fast to the surfaces of the respective substrates. In case of the washing with the use of the SC1 solution, the substrates and various particles tend to have respective negative surface electric potentials because the SC1 solution has pH of nearly 10. This causes an electrostatic repulsion between the respective surfaces of the substrates and the respective various particles, thereby allowing effective removal of the various particles.

Specifically, the washing is carried out, for example, under the condition that the glass substrate 20 and the single crystal silicon substrate 60 are immersed, for approximately 5 minutes to 20 minutes, in an SC1 mixture solution in which ammonium hydroxide ($NH_4OH$: 30%), hydrogen peroxide solution ($H_2O_2$: 30%), and water ($H_2O$) are mixed in a predetermined proportion.

It is preferable that a solution temperature at which the glass substrate 20 is washed is different from a solution temperature at which the single crystal silicon substrate 60 is washed.

Specifically, the single crystal silicon substrate 60 is preferably washed at a temperature which falls in a range from 60° C. to 100° C. In contrast, the glass substrate 20 is preferably washed at a room temperature, i.e., at a temperature which falls in a range from 20° C. to 40° C., more preferably at a temperature around 25° C.

This is because a glass material is generally eluted by an alkali solution. Therefore, this easily causes the glass substrate 20 not to have a smooth surface in a case where the glass substrate 20 is immersed in the SC1 solution of a high temperature. In view of this, in a case where the glass substrate 20 is immersed in the SC1 solution around the room temperature, it is possible to suppress the glass substrate 20 not having a smooth surface. This ultimately allows a reduction in air bubbles in the interface IF.

A specific composition of the SC1 solution can be varied as appropriate. In a case where a ratio of ammonium hydroxide, hydrogen peroxide solution, and water is expressed as A, B, C, respectively, it is possible, for example, that A falls in a range from 0 to 1, B falls in a range from 1 to 5, and C falls in a range from 5 to 20.

A more specific composition of the SC1 solution is described later with reference to Examples.

A solution used in the washing is not limited to the SC1 solution, but can be changed in various ways.

The substrates can be washed with the use of only hydrogen peroxide solution and water, for example (i) in a case where the surfaces of the respective substrates are not polluted so much, i.e., are clean (in a case where no particle and no metal contaminant exist) and (ii) in a case where it is only necessary that the surfaces are made hydrophilic. This is because the surfaces can be made hydrophilic without behavior of the ammonium hydroxide.

In a case where the glass substrate 20 is washed in such a solution containing no ammonium hydroxide, the glass substrate 20 tends to have a smooth surface since the solution is alkalescent.

(Silicon Substrate, Glass Substrate: Water Washing, Drying (ST4 and ST5 of FIG. 2))

After the substrates (the single crystal silicon substrate 60 and the glass substrate 20) are washed with the use of the washing agent, the substrates are washed with the use of water and are then dried. This step causes the surfaces of the respective substrates to be made hydrophilic.

Specifically, the substrates are washed with running purified water for approximately 10 minutes. The purified water preferably has a specific resistance of not less than 10 MΩcm, for example.

After the substrates are washed with water, the surfaces of the respective substrates are quickly dried with the use of a spin drier, for example.

(Silicon Substrate, Glass Substrate: Plasma Treatment (ST6 and ST7 of FIG. 2))

Next, the single crystal silicon substrate 60 and the glass substrate 20 are exposed to plasma under a normal pressure (atmospheric pressure). Specifically, the substrates are exposed to the plasma caused by dielectric-barrier discharge so that no voltage is directly applied to the surfaces of the respective substrates.

Such exposure under the normal pressure allows the surface of the single crystal silicon substrate 60 and the surface 24 of the glass substrate 20 to be made more hydrophilic without causing the surfaces to have great damage. That is, it is possible to reduce contact angles of the respective surfaces of the substrates without causing a great increase in roughness of the substrates.

Note that the plasma treatment is not limited to the one in which the substrates are exposed to plasma under the normal pressure. Any treatment can be employed, provided that it is possible to improve hydrophilicity of the surfaces of the respective substrates without making the surfaces rough (without causing the surfaces to have a damage).

(Combining, Low-Temperature Heat Treatment (ST8 of FIG. 2))

Next, the single crystal silicon substrate 60 and the glass substrate 20 each of which has been washed and made hydrophilic as above are combined with each other.

Specifically, a transferring surface 68 of the single crystal silicon substrate 60 is combined with a transferred surface 26 of the glass substrate 20.

Subsequently, the substrates are subjected to low-temperature heat treatment at a temperature which falls in a range from 150° C. to 300° C. for 10 minutes to 600 minutes, for example.

(Heat Treatment for Separation (ST9 of FIG. 2))

Next, the single crystal silicon substrate 60 that is combined with the glass substrate 20 is separated (divided) so that the single crystal silicon film 50 is formed on the surface 24 of the glass substrate 20.

The single crystal silicon film 50 is formed by heating whole of the glass substrate 20 with which the single crystal silicon substrate 60 is combined. Specifically, annealing treatment (heating treatment) is carried out with respect to the glass substrate 20 in an electric furnace or with the use of an anneal lamp for 1 minute at 600° C., for example.

The annealing treatment causes the peel layer 64 to be separated from the single crystal silicon substrate 60, so that the single crystal silicon substrate main body 66 serving as a main body of the silicon substrate and the single crystal silicon film 50 serving as a silicon film which is in close contact with the glass substrate 20 are separately provided, as described earlier with reference to (e) of FIG. 8.

Typically, the steps cause provision of the semiconductor apparatus 10 of the present embodiment.

The semiconductor apparatus 10 is used as a base substrate in a manufacturing process of peripheral devices and/or in a connecting process of the peripheral devices. In other cases, especially in a case where a single crystal silicon film is transferred as in the present embodiment, the semiconductor apparatus 10 is used as a base substrate in a process of manufacturing TFTs.

(Substrate Roughness)

A feature of the semiconductor apparatus 10 of the present embodiment resides in that each of the substrates (i.e., the single crystal silicon substrate 60 and the glass substrate 20), especially the glass substrate 20 out of them, has a smooth surface.

Specifically, the glass substrate 20 used in the present embodiment has an arithmetic mean roughness (Ra: JIS B0601) of not more than 0.4 nm, preferably not more than 0.3 nm, more preferably not more than 0.2 nm, for example. The arithmetic mean roughness is a parameter indicative of a surface roughness.

This easily causes an improvement in contact of such, the transferred surface 26 of the glass substrate 20 with the transferring surface 68 of the single crystal silicon substrate 60. This ultimately tends to allow good self-combining property and high binding energy. As a result, the bubble 80, which appears to tend to occur in an area where the binding energy is small, hardly occurs in the interface IF between the single crystal silicon substrate 60 (the single crystal silicon film 50) and the glass substrate 20.

A method for manufacturing a substrate having such smoothness is not limited to a specific one. A surface of the substrate can be smoothened by CMP (Chemical Mechanical Polishing), for example.

As described above, in a case where the transferring surface 68 and the transferred surface 26 are bad in smoothness, self-combining will never occur (transfer will never occur) or a gap is likely to occur in the interface IF even if the transfer occurs. In contrast, in a case where the surfaces of the substrates have respective high smoothness, the transfer can be carried out well and a gap hardly occurs.

(Hydrophilicity)

The following description deals with hydrophilicity of each of the single crystal silicon substrate 60 and the glass substrate 20 in the semiconductor apparatus 10 of the present embodiment.

The single crystal silicon substrate 60 and the glass substrate 20 of the present embodiment are made hydrophilic, as described earlier with reference to FIG. 2 and other drawings. Specifically, the surface of the single crystal silicon substrate 60 and the surface of the glass substrate 20 are made hydrophilic in a process of washing with the SC1 solution, in a process of washing with water, or in a process of exposure to plasma, for example.

This causes each of the transferring surface 68 of the single crystal silicon substrate 60 and the transferred surface 26 of the glass substrate 20 to have a contact angle of not more than 5° with respect to water.

Note that such a contact angle is measured with the use of a contact angle measuring apparatus. Specifically, such a contact angle is measured based on an image whose picture is taken, in a cross-section observation direction, at the moment when a water droplet reaches the transferring surface 68 or the transferred surface 26. Note also that (i) temperatures of a sample and the like during the measurement are set to 25° C., (ii) an amount of the water droplet is 1 microliter, and (iii) "distilled water for injection" manufactured by Otsuka pharmaceutical Co., Ltd is used as the water droplet.

Since each of the transferring surface 68 and the transferred surface 26 has the contact angle described above, good chemical bonding, for example, siloxane bonding is likely to occur between the transferring surface 68 and the transferred surface 26. This causes an easy increase in binding energy between the single crystal silicon substrate 60 (single crystal silicon film 50) and the glass substrate 20. As a result, the bubble 80 hardly occurs in the interface IF.

Good hydrophilicity as represented by a contact angle of not more than 5° can be suitably realized, for example by carrying out the plasma treatment (exposure to plasma) with respect to the transferring surface 68 of the single crystal silicon substrate 60 and the transferred surface 26 of the glass substrate 20.

In a case where the surfaces of the respective substrates have both smoothness and hydrophilicity that is premised on good washing, it is possible (i) to obtain such a binding energy that cannot be obtained in a case where the surfaces of the respective substrates have only one of the smoothness and hydrophilicity, and (ii) to suppress occurrence of the bubble 80.

(SC1 Treatment and Surface Roughness)

Figure 3:
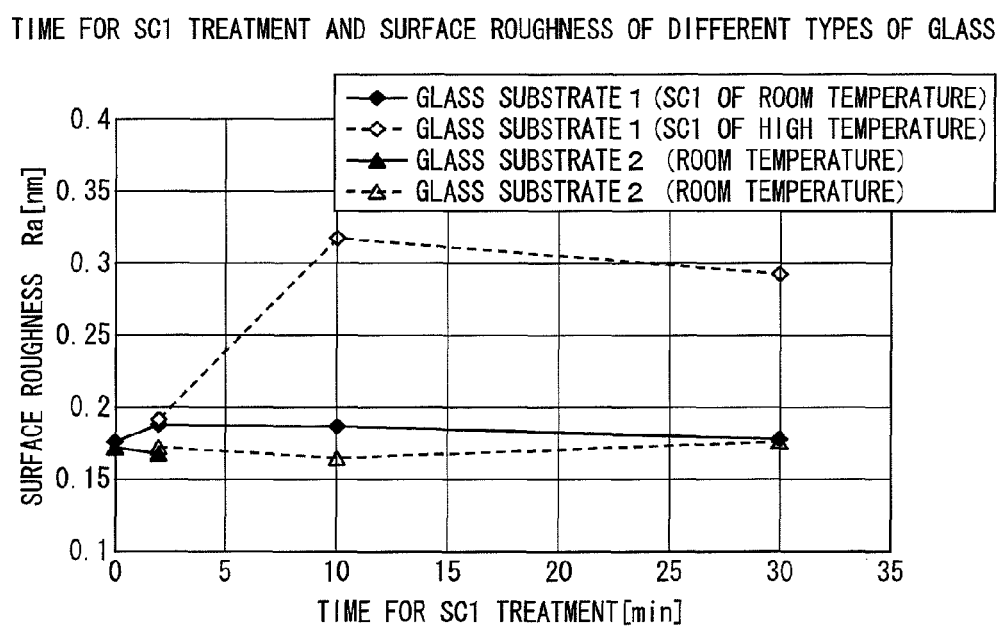
FIG. 3 is a graph showing a relationship between conditions for SC1 washing and surface roughness of a glass substrate in the embodiment of the present invention.

The following description deals with a relationship between (i) conditions under which the SC1 treatment is carried out with respect to the glass substrate 20 and (ii) the surface roughness Ra of the glass substrate 20 which has been subjected to the SC1 treatment, with reference to FIG. 3. FIG. 3 is a graph showing the relationship between the conditions for the SC1 washing and the surface roughness of the glass substrate. Note that the SC1 washing in FIG. 3 shows when ammonium hydroxide:hydrogen peroxide solution:water=A:B:C=1:3:12 are satisfied.

As is clear from FIG. 3, the surface roughness of the glass substrate 20 can be suppressed in a case where the glass substrate 20 to be subjected to the transferring treatment is washed in the SC1 solution of a room temperature. Specifically, in a case where the glass substrate 20 is washed at a high temperature (70° C.) for not less than 10 minutes, the surface roughness Ra increases to around 0.3 nm, whereas good smoothness can be maintained without causing almost no change in smoothness (Ra) in a case where the glass substrate 20 is washed at a room temperature (25° C.) for 30 minutes.

That is, the SC1 treatment at a room temperature allows the surface 24 of the glass substrate 20 to be made hydrophilic without sacrificing smoothness of the glass substrate 20.

Note that the surface roughness Ra shown in FIG. 3 are found based on a result of observing, with the use of the AFM, the surface 24 of the glass substrate 20.

Embodiment 2

Embodiment 2 of the present invention is described below mainly with reference to FIGS. 3 and 4. Note that an arrangement in the present embodiment is identical to that in the Embodiment 1 except for points described in the present embodiment. Further, note that, for convenience of description, constituents which have identical functions as those shown in the drawings of the Embodiment 1 are given identical reference numerals, and are not explained repeatedly.

A semiconductor apparatus 10 of the present embodiment is different from the semiconductor apparatus 10 of the Embodiment 1 in that (i) a first silicon oxide film 22 serving as an oxide film is provided on a surface 24 of a glass substrate 20 serving as an insulating substrate for a semiconductor apparatus, and (ii) a second silicon oxide film 70 serving as an oxide film is provided on a surface of a single crystal silicon substrate 60 serving as a silicon substrate. This is described below.

(Arrangement of Semiconductor Apparatus)

Figure 4:
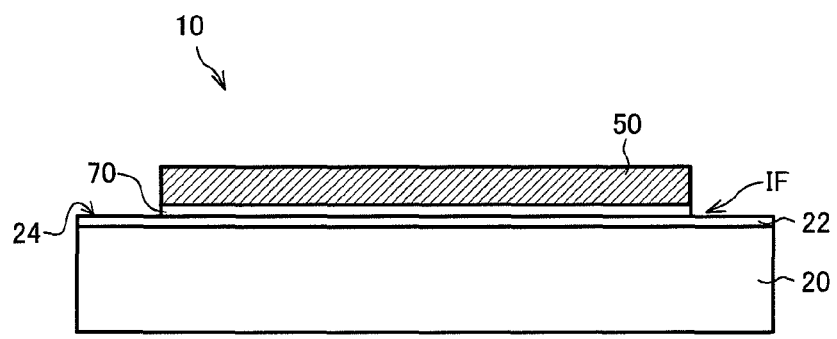
FIG. 4 is a cross-sectional view schematically illustrating an arrangement of a semiconductor apparatus of another embodiment of the present invention.

FIG. 4 is a cross-sectional view schematically illustrating an arrangement of the semiconductor apparatus 10 of the present embodiment. As shown in FIG. 4, the semiconductor apparatus 10 is arranged so that a single crystal silicon film 50 is provided above the glass substrate 20. The semiconductor apparatus 10 of the Embodiment 2 is different from the semiconductor apparatus 10 of the Embodiment 1 in that the first silicon oxide film 22 and the second silicon oxide film 70 are provided between the single crystal silicon film 50 and the glass substrate 20. Note that the second silicon oxide film 70 is preferably provided only on part of a surface of the first silicon oxide film 22 which part comes into contact with the first silicon oxide film 22. With the arrangement, the single crystal silicon film 50 is firmly combined with the glass substrate 20, and therefore a bubble 80 becomes more hard to occur in an interface IF between the single crystal silicon film 50 and the glass substrate 20.

This is because the provision of the oxide films allows an improvement in hydrophilicity (wettability) of the surfaces and an improvement in self-combining of the surfaces.

(Outline of Manufacturing Method)

Figure 5:
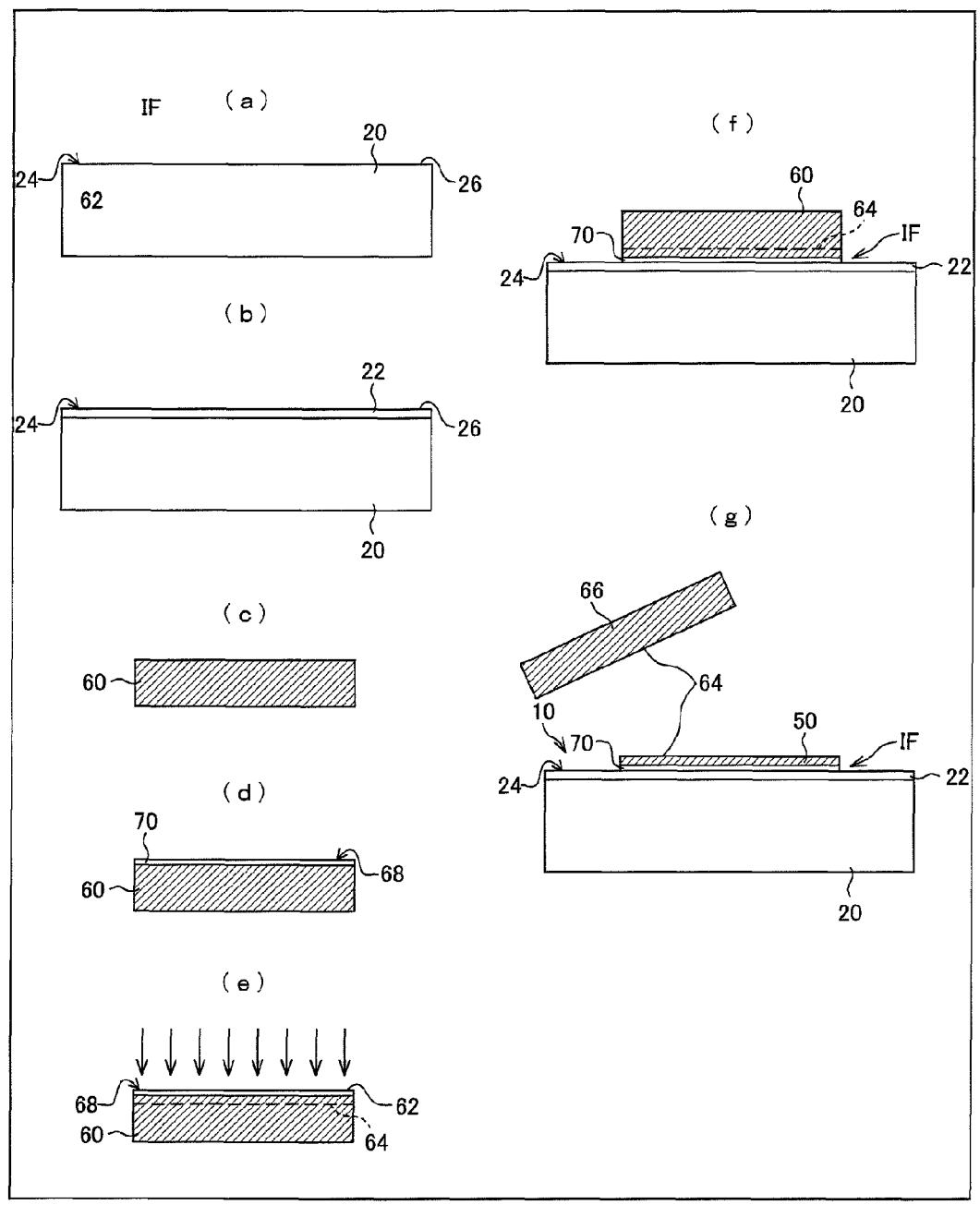
FIG. 5 is a cross-sectional view schematically illustrating a manufacturing step of the semiconductor apparatus of the embodiment of the present invention.

The following description deals with a method for manufacturing the semiconductor apparatus 10 of the present embodiment with reference to FIG. 5. FIG. 5 is a cross-sectional view schematically illustrating manufacturing steps of the semiconductor apparatus 10.

Since a brief method for manufacturing the semiconductor apparatus 10 is common to that explained earlier with reference to FIG. 8, the following description mainly deals with steps different from the method shown in FIG. 8.

Specifically, according to the Embodiment 2, a silicon oxide film is formed on at least one of a transferred surface 26 of the glass substrate 20 and a transferring surface 68 of the single crystal silicon substrate 60 before the glass substrate 20 and the single crystal silicon substrate 60 are combined with each other. More specifically, the silicon oxide film is preferably formed on at least the surface 68 of the single crystal silicon substrate 60.

Specifically, the first silicon oxide film 22 is formed on a surface of the glass substrate 20, as shown in (b) of FIG. 5.

Further, the second silicon oxide film 70 is formed on a surface of the single crystal silicon substrate 60, as shown in (d) of FIG. 5. Subsequently, hydrogen ions serving as separatory materials are implanted into the single crystal silicon substrate 60 via the second silicon oxide film 70, as shown in (e) of FIG. 5.

Note that the formation of the oxide films and the implantation of the separatory materials may be carried out in reverse order.

Next, the single crystal silicon substrate 60 on which the second silicon oxide film 70 has been formed is combined with the glass substrate 20 on which the first silicon oxide film 22 has been formed (see (f) of FIG. 5).

(Oxide Film)

The following description deals with, in detail, a method for forming the silicon oxide films (the first oxide film 22 and the second oxide film 70) serving as oxide films.

(First Silicon Oxide Film)

First, the first silicon oxide film 22 formed on the glass substrate 20 is described below.

The first silicon oxide film 22 has, for example, a thickness of approximately 5 nm to 300 nm, preferably has a thickness of approximately 5 nm to 100 nm.

A method for forming the first silicon oxide film 22 is not limited to a specific one. The first silicon oxide film 22 can be formed, for example, by plasma CVD (Chemical Vapor Deposition), as follows. Specifically, in a vacuum chamber, TEOS (Tetra Ortho Silicate) gas and oxygen gas are mixed, and are then subjected to plasma discharge at approximately 320° C. With the method (TEOS-$O_2$ plasma method), an oxide film, for example, having a thickness of approximately 100 nm can be obtained.

Since the first silicon oxide film 22 is formed, under a thermal non-equilibrium state, at a relatively low temperature (in a range from 300° C. to 400° C.), a composition ratio of silicon:oxygen may not be exactly equal to 1:2, but be equal to 1:1.9 or so, for example. That is, the first silicon oxide film 22 of the present embodiment is a so-called silicon oxide film, i.e., $SiO_2$ insulating film.

(Second Silicon Oxide Film)

Next, the second silicon oxide film 70 formed on the single crystal silicon substrate 60 is described below.

The second silicon oxide film 70 can be formed, for example, by thermally oxidizing a surface of the single crystal silicon substrate 60.

A method for forming the second silicon oxide film 70 is not limited to a specific one. For example, the second silicon oxide film 70 can be formed by PCVD, as in the case of the glass substrate 20. For example, in a case where a device is formed on the surface of the single crystal silicon substrate

60, an oxide film is suitably formed (deposited), as an interlayer insulating film, by the PCVD.

The second silicon oxide film 70 formed by such a method has a thickness of approximately 100 nm, for example. The thickness of the second silicon oxide film 70 is not limited to a specific one, and preferably falls in a range from 5 nm to 300 nm, more preferably in a range from 5 nm to 100 nm. Note that the second silicon oxide film 70 is an $SiO_2$ insulating film.

The glass substrate 20 and the single crystal silicon substrate 60 on which the respective oxide films have been thus formed were washed with an SC1 solution, washed with purified water, dried, and then combined with each other, as described earlier. The glass substrate 20 and the single crystal silicon substrate 60 could be combined with each other with a small force. In other words, good self-combining (voluntary combining) could be obtained.

Further, a bubble 80 hardly occurred in the interface IF, as described earlier.

The above description has dealt with, as an example of the embodiment, a case where an oxide film is formed on each of the glass substrate 20 and the single crystal silicon substrate 60. However, the present embodiment is not limited to this arrangement. For example, another arrangement is possible in which no oxide film is formed on the glass substrate 20.

Embodiment 3

Embodiment 3 of the present invention is described below mainly with reference to FIG. 6. Note that an arrangement in the present embodiment is identical to that in each of the Embodiments 1 and 2 except for points described in the present embodiment. Further, note that, for convenience of description, constituents which have identical function as those shown in drawings of the Embodiment 1 are given identical reference numerals, and are not explained repeatedly.

A semiconductor apparatus 10 of the present embodiment is different from the semiconductor apparatus 10 of the Embodiment 1 in that a polysilicon layer, for example, a polysilicon TFT 90 is formed on a glass substrate 20, in addition to a single crystal silicon film 50 formed on the glass substrate 20 by a transferring process (combining process). This is described below with reference to the drawings.

(Structure of Semiconductor Apparatus)

Figure 6:
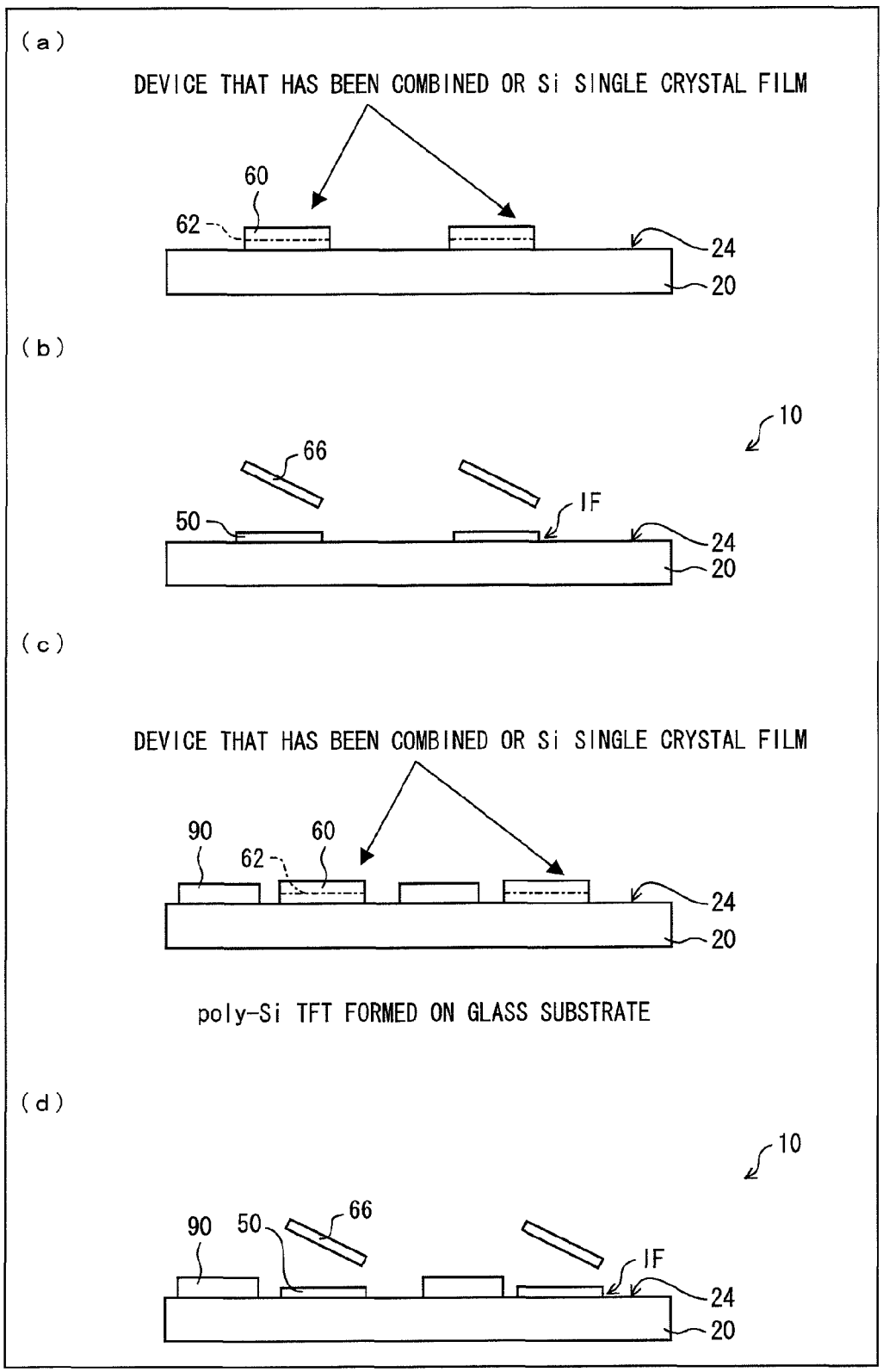
FIG. 6 is a cross-sectional view schematically illustrating an arrangement of a semiconductor apparatus of another embodiment of the present invention.

FIG. 6 is a cross-sectional view schematically illustrating an arrangement of the semiconductor apparatus 10. (a) and (b) of FIG. 6 each show the semiconductor apparatus 10 of the Embodiment 1, and (c) and (d) of FIG. 6 each show the semiconductor apparatus 10 of the present embodiment.

Comparison between (a) of FIG. 6 and (c) of FIG. 6 and comparison between (b) of FIG. 6 and (d) of FIG. 6 make it possible to compare (i) the semiconductor apparatus 10 of the Embodiment 1 and (ii) the semiconductor apparatus 10 of the present embodiment in terms of structure obtained in the same step.

The semiconductor apparatus 10 of the present embodiment is arranged such that (i) a device made of polysilicon and (ii) single crystal silicon or a device made of single crystal silicon coexist on the glass substrate 20 (see (a) through (d) of FIG. 6).

A method for manufacturing the semiconductor apparatus 10 is not limited to a specific one. For example, the semiconductor apparatus 10 can be manufactured as follows: a polysilicon layer is formed on the glass substrate 20, a device such as a polysilicon TFT is formed while the polysilicon layer is being used as a base material, and an etching is carried out with respect to, for example, a region (e.g. transferred surface 26) of the glass substrate 20, onto which region the single crystal silicon substrate 60 is to be transferred, so that the surface of the glass substrate 20 is exposed in the region.

(Transfer of Device)

In each of the above embodiments, instead of the single crystal silicon substrate 60, a substrate on which a device such as a transistor is formed in advance can be used as a silicon substrate to be transferred onto the glass substrate 20 serving as an insulating substrate.

(Example of Use of Semiconductor Apparatus)

Figure 7:
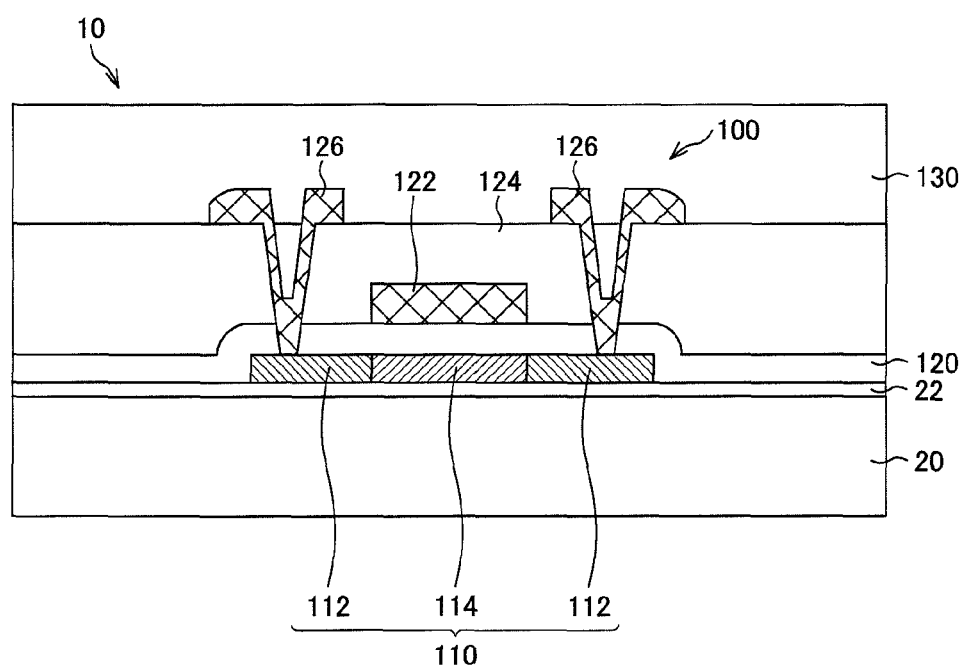
FIG. 7 is a cross-sectional view schematically illustrating how the semiconductor apparatus of the embodiment of the present invention is used.

The following description deals with how the semiconductor apparatus 10 in which the single crystal silicon film 50 serving as a silicon film is transferred is used, with reference to FIG. 7. FIG. 7 is a cross-sectional view schematically illustrating how the semiconductor apparatus 10 is used.

For example, a TFT 100 can be prepared by using the semiconductor apparatus 10 as a base material (see FIG. 7). In this case, out of constituents of the TFT 100, a low resistance silicon film 112 and a channel region 114 are prepared with the use of the single crystal silicon film 50 which has been transferred onto the glass substrate 20.

With the arrangement, a semiconductor device such as a high-performance TFT can be easily formed on an insulating substrate.

The semiconductor apparatus 10 shown in FIG. 7 is arranged such that a gate insulating film 120 is formed on a single crystal silicon region 110, and a gate electrode film 122 and an interlayer insulating film 124 are formed on the gate insulating film 120. A source/drain metal layer 126 is electrically connected to the low resistance silicon film 112. Note that an oxide film (silicon oxide film) 130 can be formed on an entire surface of the TFT 100. Note, however, that a structure of the device is not limited to this.

EXAMPLES

Concrete Examples of the semiconductor apparatuses 10 of the respective embodiments are described below.

Note that, in the following Examples, only essential points such as conditions for SC1 washing are described, and reference numerals etc. comply with those in each of the embodiments.

Further, surface roughness Ra of a glass substrate is also described with reference to FIG. 3 which is a graph showing a relationship between the conditions for SC1 washing and the surface roughness of the glass substrate.

Example 1

A semiconductor element (semiconductor device) such as a transistor as represented by a TFT was prepared on a single crystal silicon substrate 60.

Next, a surface (transferring surface 68) of the single crystal silicon substrate 60 (semiconductor device/semiconductor element substrate) was smoothened by CMP (Chemical Mechanical Polishing).

In a process of preparing the semiconductor device, implantation of hydrogen serving as a separatory material was carried out after the smoothening of the surface. Thus, a peel layer (separating layer) 64 was formed in the single crystal silicon substrate 60. Note that the implantation of the hydrogen was carried out, for example, in such an order of steps that the hydrogen thus implanted did not escape from the single crystal silicon substrate 60.

Next, the semiconductor element substrate was processed so as to be converted into a chip of a desired size by a method such as dicing, and then a surface of the chip was washed with an SC1 washing solution ($NH_4OH:H_2O_2:H_2O=0.01:1:5$) of 85° C.

Meanwhile, a glass substrate 20 to which the chip is to be transferred was washed with an SC1 solution ($NH_4OH:H_2O_2:H_2O=0.01:1:5$) of a room temperature for five minutes.

The chip was combined with the glass substrate 20, and was then subjected to heat treatment for separation along the peel layer 64 so that the chip was separated into one region to be transferred (the single crystal silicon film 50, specifically single crystal silicon device region) and the other region (single crystal silicon substrate main body 66).

Example 2

A surface of a single crystal silicon substrate 60 was thermally oxidized, and hydrogen serving as a separatory material was implanted into the single crystal silicon substrate 60 so that a peel layer 64 was formed.

The surface of the single crystal silicon substrate 60 was washed with an SC1 washing solution ($NH_4OH:H_2O_2:H_2O=0.25:1:10$) of 80° C.

Subsequently, the single crystal silicon substrate 60 was cut so as to have a desired size.

Meanwhile, a glass substrate 20 to which the single crystal silicon substrate 60 is to be transferred was washed with an SC1 solution ($NH_4OH:H_2O_2:H_2O=0.25:1:10$) of a room temperature.

Subsequently, the single crystal silicon substrate 60 was combined with the glass substrate 20, and was then subjected to heat treatment for separation along the peel layer 64 so that the single crystal silicon substrate 60 was separated into one region to be transferred (the single crystal silicon film 50) and the other region (single crystal silicon substrate main body 66).

Example 3

A semiconductor element (semiconductor device) such as a transistor represented by a TFT was prepared on a single crystal silicon substrate 60.

Next, a surface (transferring surface 68) of the single crystal silicon substrate 60 (semiconductor device/semiconductor element substrate) was smoothened by CMP (Chemical Mechanical Polishing).

In a process of preparing the semiconductor device, implantation of hydrogen serving as a separatory material was carried out after the smoothening of the surface. Thus, a peel layer (separating layer) 64 was formed in the single crystal silicon substrate 60. After the implantation of the hydrogen, the single crystal silicon substrate 60 was not heated to such a temperature that the hydrogen thus implanted escaped from the single crystal silicon substrate 60, for example.

Next, the semiconductor element substrate was processed so as to be converted into a chip of a desired size by a method such as dicing, and then a surface of the chip was washed with an SC1 washing solution ($NH_4OH:H_2O_2:H_2O=0.5:2:15$) of 85° C.

Meanwhile, a glass substrate 20 to which the chip is to be transferred was washed with an SC1 solution ($NH_4OH:H_2O_2:H_2O=0.5:2:15$) of a room temperature for ten minutes.

Subsequently, the chip and the glass substrate 20 were exposed to plasma under a normal pressure.

The chip was combined with the glass substrate 20, and was then subjected to heat treatment for separation along the peel layer 64 so that the chip was separated into one region to be transferred (single crystal silicon film 50, specifically single crystal silicon device region) and the other region (single crystal silicon substrate main body 66).

Example 4

A surface of a single crystal silicon substrate 60 was thermally oxidized, and hydrogen serving as a separatory material was implanted into the single crystal silicon substrate 60 so that a peel layer 64 was formed.

The surface of the single crystal silicon substrate 60 was washed with an SC1 washing solution ($NH_4OH:H_2O_2:H_2O=1:2:15$) of 80° C.

Subsequently, the single crystal silicon substrate 60 was cut so as to have a desired size.

Meanwhile, a glass substrate 20 to which the single crystal silicon substrate 60 is to be transferred was washed with an SC1 solution ($NH_4OH:H_2O_2:H_2O=0.5:2:15$) of a room temperature.

Subsequently, the single crystal silicon substrate 60 and the glass substrate 20 were exposed to plasma under a normal pressure.

Subsequently, the single crystal silicon substrate 60 was combined with the glass substrate 20, and was then subjected to heat treatment for separation along the peel layer 64 so that the single crystal silicon substrate 60 was separated into one region to be transferred (the single crystal silicon film 50) and the other region (single crystal silicon substrate main body 66).

Example 5

A semiconductor element (semiconductor device) such as a transistor represented by a TFT was prepared on a single crystal silicon substrate 60.

Next, a surface (transferring surface 68) of the single crystal silicon substrate 60 (semiconductor device/semiconductor element substrate) was smoothened by CMP (Chemical Mechanical Polishing).

In a process of preparing the semiconductor device, implantation of hydrogen serving as a separatory material was carried out after the smoothening of the surface. Thus, a peel layer (separating layer) 64 was formed in the single crystal silicon substrate 60. After the implantation of the hydrogen, the device was prepared so that the hydrogen thus implanted did not escape from the single crystal silicon substrate 60.

Next, the semiconductor element substrate was processed so as to be converted into a chip of a desired size by a method such as dicing, and then a surface of the chip was washed with an SC1 washing solution ($NH_4OH:H_2O_2:H_2O=0.25:1:12$) of 65° C.

Meanwhile, a polysilicon TFT was formed on a glass substrate 20 to which the chip was also to be transferred, and an etching is carried out with respect to a region of the glass substrate 20, onto which region a single crystal silicon device (the semiconductor device) was to be transferred, so that the surface of the glass substrate 20 is exposed in the region.

The glass substrate 20 was washed with an SC1 solution ($NH_4OH:H_2O_2:H_2O=0:1:12$) of a room temperature for five minutes.

Subsequently, the semiconductor device and the glass substrate 20 were exposed to plasma under a normal pressure.

Next, the chip was combined with the glass substrate 20, and was then subjected to heat treatment for separation along the peel layer 64 so that the chip was separated into one region to be transferred (the single crystal silicon film 50) and the other region (single crystal silicon substrate main body 66).

Example 6

A surface of a single crystal silicon substrate 60 was thermally oxidized, and hydrogen serving as a separatory material was implanted into the single crystal silicon substrate 60 so that a peel layer 64 was formed.

The surface of the single crystal silicon substrate 60 was washed with an SC1 washing solution ($NH_4OH:H_2O_2:H_2O=1:1:5$) of 70° C.

Subsequently, the single crystal silicon substrate 60 was cut so as to have a desired size.

Meanwhile, a polysilicon TFT was formed on a glass substrate 20 to which the chip is also to be transferred, and an etching is carried out with respect to a region of the glass substrate 20, onto which region a single crystal silicon device (the semiconductor device) was to be transferred, so that the surface of the glass substrate 20 is exposed in the region.

A $SiO^2$ film of 10 nm (5 nm to 100 nm) was deposited on the surface of the glass substrate 20 by PCVD.

Subsequently, the glass substrate 20 was washed with an SC1 solution ($NH_4OH:H_2O_2:H_2O=0.5:1:15$) of a room temperature for five minutes.

Next, the single crystal silicon substrate 60 (semiconductor device) and the glass substrate 20 were exposed to plasma under a normal pressure.

Subsequently, the single crystal silicon substrate 60 (semiconductor device) was combined with the glass substrate 20, and was then subjected to heat treatment for separation along the peel layer 64 so that the single crystal silicon substrate 60 was separated into one region to be transferred (the single crystal silicon film 50) and the other region (single crystal silicon substrate main body 66).

In the Examples 5 and 6, the glass material can be exposed in an etched region (transferred region) of the glass substrate 20. Alternatively, an oxide film such as a silicon oxide film can be formed on the surface of the glass substrate 20 so that the oxide film is exposed in an etched region.

According to the semiconductor apparatus 10 of each of the Examples, no bubble 80 due to the transferring occurred in the interface IF.

Examples of a preferable ratio (range) of ammonium hydroxide, hydrogen peroxide solution, and water in the SC1 treatment were described above. More specifically, it was revealed that the transferring can be carried out well in cases of satisfying A:B:C (ammonium hydroxide:hydrogen peroxide solution:water)=0.01:1:5 (Example 1), A:B:C=0.25:1:10 (Example 2), A:B:C=0.5:2:15 (Example 3), A:B:C=1:2:15 (Example 4), and A:B:C=0:1:12 (Example 5).

Note that an SC1 solution used in the washing of a silicon substrate that is transferred onto an insulating substrate can be different in composition (compounding ratio) and/or process conditions such as temperature and/or time period from that used in the washing of the insulating substrate onto which the silicon substrate is transferred.

The semiconductor apparatus 10 of the present invention is not limited to a specific application. For example, the semiconductor apparatus 10 of the present invention can be applied to a liquid crystal display device. Specifically, the semiconductor apparatus 10 of the present invention can be used as a so-called TFT substrate in a so-called active matrix liquid crystal display device, for example.

The descriptions have dealt with a case where the single crystal silicon substrate 60 is used as a silicon substrate but do not intend to limit to this. Alternatively, a polysilicon substrate can be used as the silicon substrate or a single crystal silicon semiconductor substrate in which an impurity is mixed to a single crystal silicon can be used as the silicon substrate.

Further, the descriptions have dealt with a case where the glass substrate 20 is used as an insulating substrate for a semiconductor apparatus but do not intend to limit to this. For example, a quartz substrate or a plastic substrate can be used as the insulating substrate.

Further, the descriptions have dealt with an arrangement in which a silicon oxide film (the first silicon oxide film 22 and the second silicon oxide film 70) serving as an oxide film is provided on each of a silicon substrate (single crystal silicon substrate) and an insulating substrate (glass substrate 20) for a semiconductor apparatus but do not intend to limit to this. For example, such a silicon oxide film may be provided on either one of the silicon substrate and the insulating substrate.

Further, an insulating substrate for a semiconductor apparatus of the present invention is not limited to specific shape and size. For example, the insulating substrate can have a rectangular shape when it is viewed from above, whose longer side has a length of not less than 300 mm and not more than 3000 mm and whose shorter side has a length of not less than 300 mm and not more than 3000 mm.

Further, it is preferable in the semiconductor apparatus of the present invention that a glass substrate is used as the insulating substrate and the silicon substrate is directly combined with the glass substrate.

Further, a glass substrate that is not subjected to a thermal tightening treatment can be used as the insulating substrate of the semiconductor apparatus in accordance with the present invention. Note that the thermal tightening treatment generally intends to a heat treatment carried out at a temperature which falls in a range from 600° C. to 700° C., for example.

Further, the heat treatment (the heat treatment for separation), which is carried out after the insulating substrate and the silicon substrate of the present invention are combined with each other, allows a rapid reduction in temperature increased by applied heat. Specifically, the rapid reduction in temperature can be carried out at a rate of 2° C./sec, preferably at a rate of 5° C./sec, more preferably at a rate of 10° C./sec, for example.

The present invention is not limited to the description of the embodiments above, but may be altered by a skilled person within the scope of the claims. An embodiment based on a proper combination of technical means disclosed in different embodiments is encompassed in the technical scope of the present invention.

INDUSTRIAL APPLICABILITY

The semiconductor apparatus of the present invention, in which a semiconductor layer can be provided on an insulating substrate so as to be in close contact with the insulating substrate, is suitably applicable to an apparatus such as an active matrix liquid crystal display device which is required to attain high performance and high yield.

The invention claimed is:
1. An insulating substrate of a semiconductor apparatus, the semiconductor apparatus comprising the insulating substrate and a silicon film provided on the insulating substrate, the insulating substrate comprising:
   a surface which includes a transferred surface of the insulating substrate,
   wherein
   the silicon film comprises a transferring surface which is transferred onto the transferred surface, at least one of the transferring surface and the transferred surface is hydrophilic, at least one of the transferring surface and the transferred surface has a contact angle of not more than 5° with respect to water, and an arithmetic mean roughness of the transferred surface is not more than 0.4 nm.

2. The insulating substrate according to claim 1 wherein the transferred surface has an arithmetic mean roughness of not more than 0.3 nm.

3. The insulating substrate according to claim 1, wherein the transferred surface has an arithmetic mean roughness of not more than 0.2 nm.

4. The insulating substrate according claim 1, wherein the insulating material is a glass material, quartz or a plastic material.

5. The insulating substrate according to claim 4, wherein the glass material is exposed in the transferred surface.

6. The insulating substrate according to claim 1, wherein an oxide film is provided on the transferred surface.

7. The insulating substrate according claim 1, wherein the transferred surface is made hydrophilic.

8. The insulating substrate according to claim 7, wherein the transferred surface is made hydrophilic with use of a mixture solution of ammonium hydroxide, hydrogen peroxide solution, and water which mixture solution has a temperature of not less than 20° C. and not more than 40° C.

9. The insulating substrate according to claim 1, wherein the transferred surface has a contact angle of not more than 5°.

10. The insulating substrate according to claim 1, wherein the transferred surface is exposed to plasma under an atmospheric pressure.

11. The insulating substrate according to claim 1, wherein the insulating substrate has a rectangular shape when it is viewed from above, and has (i) a longer side whose length of not less than 300 mm and not more than 3000 mm and (ii) a shorter side whose length is of not less than 300 mm and not more than 3000 mm.

12. A semiconductor apparatus comprising:
the insulating substrate according to claim 1; and
a silicon film provided on the transferred surface, wherein the silicon film comprises a transferring surface which is transferred onto the transferred surface of the insulating substrate.

13. The semiconductor apparatus according to claim 12, wherein
the silicon substrate is a single crystal silicon substrate.

14. The semiconductor apparatus according to claim 12, wherein
the silicon substrate is a silicon semiconductor substrate.

15. The semiconductor apparatus according to claim 12, wherein
a semiconductor device is provided on the silicon substrate.

16. The semiconductor apparatus according to claim 12, wherein
the transferring surface of the silicon substrate is made hydrophilic.

17. The semiconductor apparatus according to claim 12, wherein
the transferring surface of the silicon substrate has a contact angle of not more than 5°.

18. The semiconductor apparatus according to claim 12, wherein
the transferring surface of the silicon substrate is exposed to plasma under an atmospheric pressure.

19. The semiconductor apparatus according to claim 12, wherein
at least one of an amorphous silicon transistor device and a polysilicon transistor device is provided in a region on the surface of the insulating substrate where said silicon film comprising the transferring surface is not provided.

20. The semiconductor apparatus according to claim 12, wherein
the insulating substrate is a glass substrate, and the silicon substrate is directly combined with the glass substrate.

21. The semiconductor apparatus according to claim 12, wherein, when the transferring surface of the silicon substrate is transferred to the transferred surface of the insulating substrate, the insulating substrate and the silicon substrate are heated, and are then rapidly cooled down.

22. The insulating substrate according to claim 1, wherein the insulating substrate comprises an insulating material.

* * * * *